US006737916B2

(12) United States Patent
Luu

(10) Patent No.: US 6,737,916 B2
(45) Date of Patent: May 18, 2004

(54) RF AMPLIFIER SYSTEM HAVING IMPROVED POWER SUPPLY

(75) Inventor: Ky Thoai Luu, Mason, OH (US)

(73) Assignee: Harris Corporation, Melbourne, FL (US)

( * ) Notice: Subject to any disclaimer, the term of this patent is extended or adjusted under 35 U.S.C. 154(b) by 83 days.

(21) Appl. No.: 10/183,601

(22) Filed: Jun. 27, 2002

(65) Prior Publication Data

US 2004/0000947 A1 Jan. 1, 2004

(51) Int. Cl.[7] .............................. H03F 3/38; H03F 3/68; H03F 1/00
(52) U.S. Cl. ..................... 330/10; 330/124 R; 330/165; 330/188; 330/195
(58) Field of Search ............................... 330/10, 124 R, 330/154, 165, 188, 195

(56) References Cited

U.S. PATENT DOCUMENTS

| | | | |
|---|---|---|---|
| 3,946,324 A | * | 3/1976 | Smith .......................... 330/10 |
| 4,580,111 A | | 4/1986 | Swanson |
| 4,719,431 A | * | 1/1988 | Karsten ...................... 330/273 |
| 4,792,746 A | * | 12/1988 | Josephson et al. .......... 323/290 |
| 4,949,050 A | | 8/1990 | Swanson |
| 6,369,651 B1 | * | 4/2002 | Dent .......................... 330/127 |

* cited by examiner

Primary Examiner—Patricia Nguyen
(74) Attorney, Agent, or Firm—Tarolli, Sundheim, Covell & Tummino L.L.P.

(57) ABSTRACT

An RF amplifier system having improved power supply is presented and which includes a plurality of power amplifiers each having an output circuit for connecting a DC voltage source to one of a plurality of primary windings located on a first transformer. The first transformer has a plurality of secondary windings located thereon with each being a single turn secondary winding. The secondary windings are connected together in series. A second transformer is located in a cascaded arrangement with the first transformer and has a like plurality of single turn primary windings connected together in series and a like plurality of secondary windings are on said second transformer with each being connected to a rectifier for providing a controlled DC voltage.

9 Claims, 5 Drawing Sheets

RF AMPLIFIER SYSTEM HAVING IMPROVED POWER SUPPLY

BACKGROUND OF THE INVENTION

1. Technical Field

This invention relates to the art of RF amplifier systems and, more particularly, to a system having an improved power supply.

2. Description of the Prior Art

The U.S. patents to H. I. Swanson, U.S. Pat. Nos. 4,580,111 and 4,949,050 disclose an amplitude modulator for use in AM radio broadcasting and wherein the modulator serves to generate an amplitude modulated signal by selectively turning on and off a plurality of RF amplifiers in a digital manner to produce amplitude modulation. Each of the RF amplifiers provides an output voltage across the primary winding of a transformer. The secondary windings of the transformers are connected together in series in a series combiner.

Such systems employed power supply circuits having transformers with multiple winding turns on both the primary and secondary sides.

SUMMARY OF THE INVENTION

In accordance with one aspect of the present invention, an RF amplifier system is disclosed having an improved power supply. The supply includes a plurality of power amplifiers each having an output circuit for connecting a DC voltage source with one of a plurality of primary windings located on a first transformer. The amplifiers are controlled by a common controller. The first transformer has a plurality of secondary windings located thereon with the secondary windings each being a single turn secondary winding. The secondary windings are connected together in series such that an output voltage is developed across the secondary windings. The second transformer is located in a cascaded arrangement with the first transformer and has a like plurality of single turn primary windings connected together in series. The single turn primary windings on the second transformer are connected in parallel with the single turn secondary windings on the first transformer. A like plurality of secondary windings are on the second transformer with each being connected to a rectifier for providing a controlled DC voltage.

BRIEF DESCRIPTION OF THE DRAWINGS

The foregoing and other advantages and features of the present invention will become readily apparent from the following description as taken in conjunction with the accompanying drawings, wherein.

DESCRIPTION OF THE PREFERRED EMBODIMENT

Figure 3:
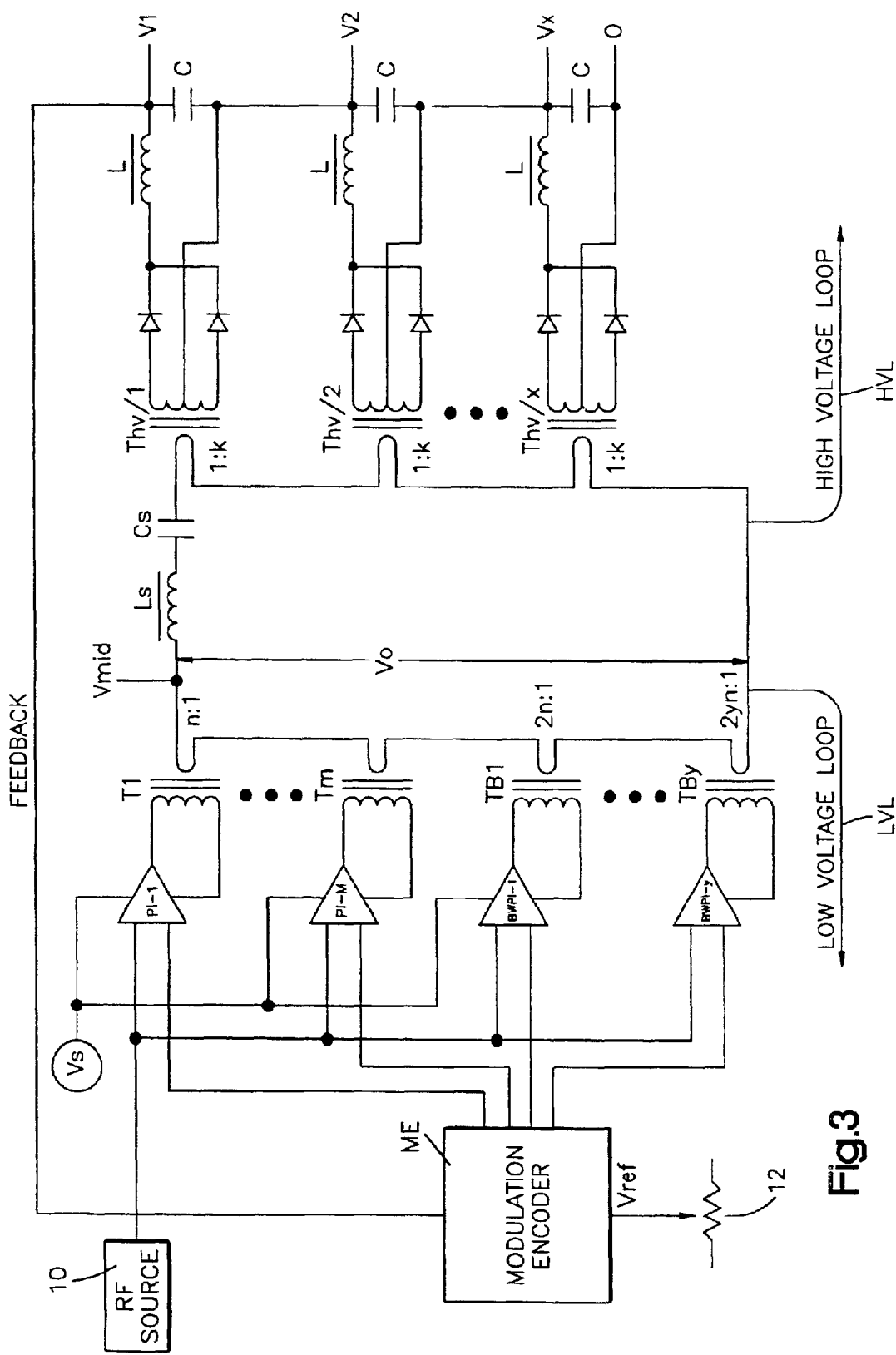
FIG. 3 is a schematic-block diagram illustration of a third embodiment of the present invention.
Figure 4:
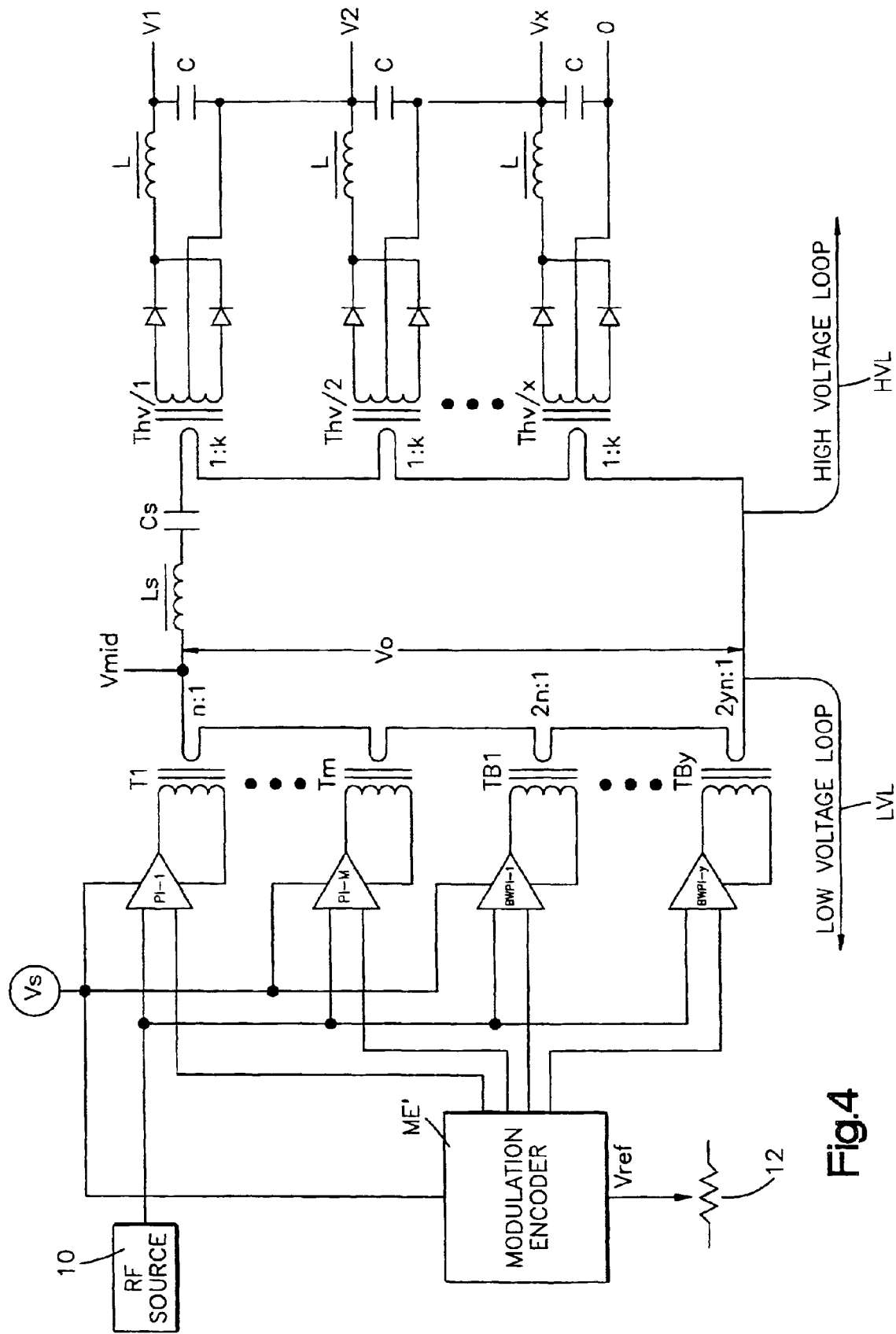
FIG. 4 is a schematic-block diagram illustration of a fourth embodiment of the invention herein.

One application of the present invention is a high efficiency, high voltage power supply for an IOT (inductive output tube) employed in a TV transmitter. The embodiments to be described hereinafter with reference to FIGS. 1 and 2 include pulse width modulated power inverter sections together with a single loop two-stage coupling transformer. This loop provides the best geometry for high voltage isolation applications. The embodiments illustrated in FIGS. 3 and 4 are modular power inverter sections together with a single loop two-stage coupling transformer.

Figure 1:
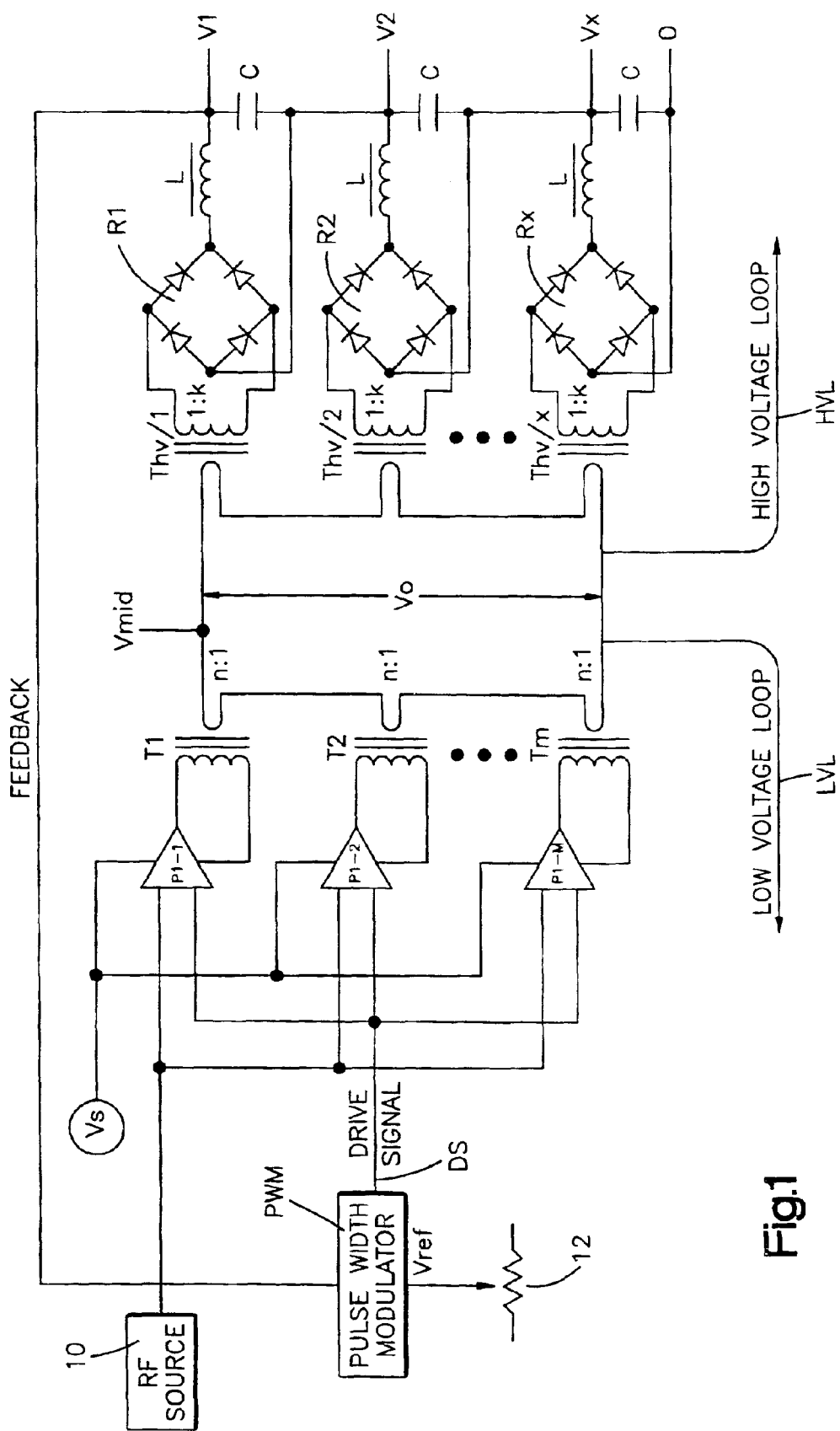
FIG. 1 is a schematic-block diagram illustration of one embodiment of the present invention.

Reference is now made to FIG. 1 which illustrates a DC voltage source $V_s$ which may be obtained from a line voltage source and, hence, the voltage will vary with fluctuations in line voltage. This DC voltage source $V_s$ is supplied as the operating voltage for each of a plurality of power inverters PI-1 to PI-M. An RF signal from a source 10 is supplied as one input to each of the power amplifiers and each is also supplied with a drive signal DS obtained from a pulse width modulator PWM. The modulator has a variable duty from 0% to 50% based on the $V_{ref}$ setting obtained from a potentiometer 12. It is to be noted that a 50% duty cycle is the maximum pulse width delivered for each power inverter. The output of each power inverter drives an isolation transformer such as transformers T1 through $T_m$.

The primary windings on these transformers have multiple turns whereas the secondary windings on these transformers have a single turn with the ratio being n to 1 from the primary to the secondary sides. The secondary windings are connected together in series to provide an output voltage $V_O$. This is the low voltage loop LVL side. The high voltage loop HVL side includes a second set of transformer primary windings each of a single turn connected together in series and in parallel with the single loop secondary windings on transformers T1 through $T_m$. The second transformer is located in a cascaded arrangement with the first transformer with the secondary windings being of multiple turns k and located on the transformers THV/1 through THV/X. Each of the secondary windings is connected to a full wave rectifier R1, R2 . . . Rx. The rectifiers are coupled to low pass L-C filters to provide the controlled or regulated output voltages V1, V2 . . . $V_X$.

Figure 2:
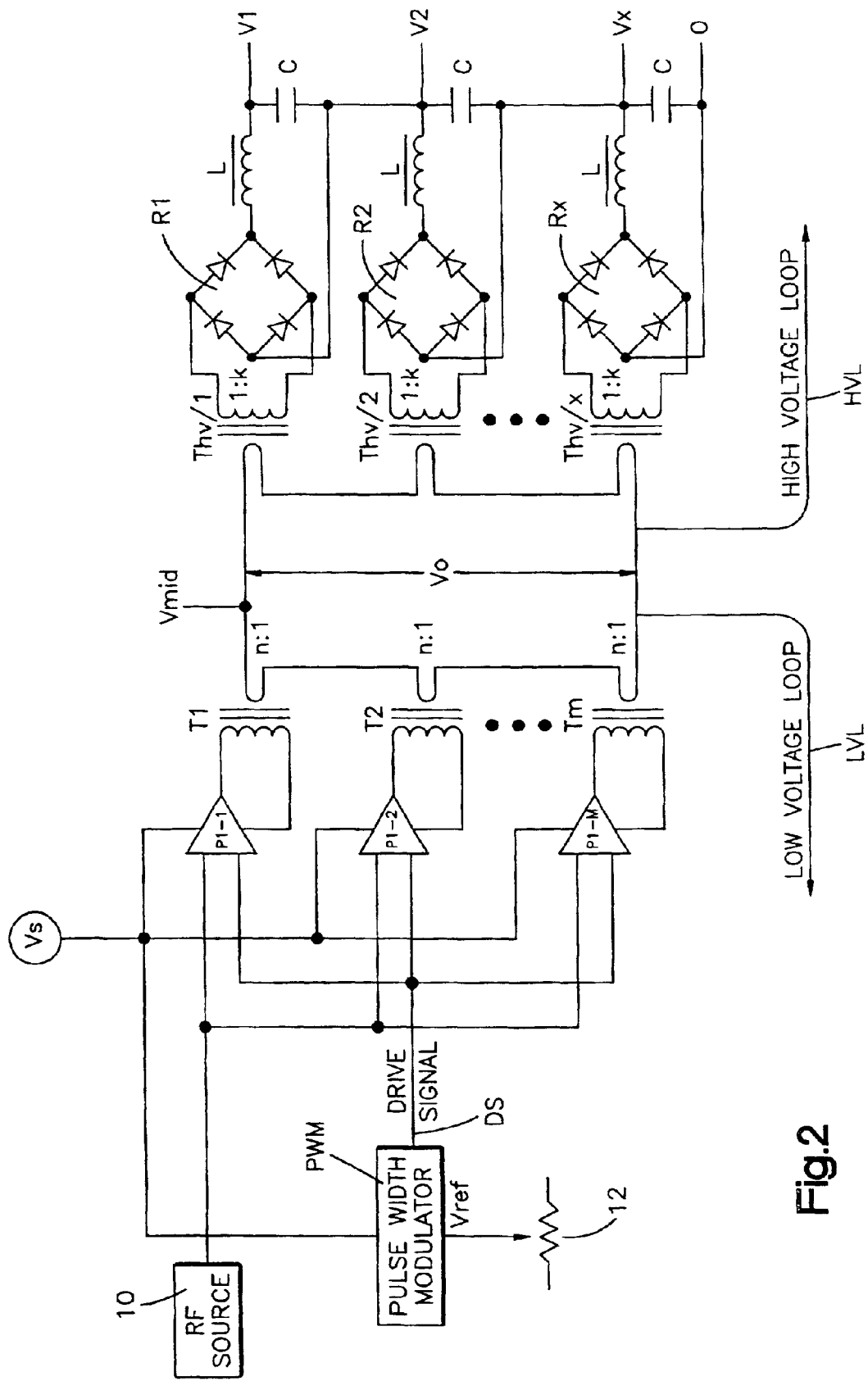
FIG. 2 is a schematic-block diagram illustration of a second embodiment of the invention herein.

It is to be noted that the embodiment illustrated in FIG. 1 and that as illustrated in FIG. 2 employ pulse width modulators. The embodiment in FIG. 1 employs a feedback approach. Thus, the output voltage V1 is compared with the reference voltage $V_{ref}$. This varies the ON/OFF duty cycle of the drive signal tending to make the output voltage V1 equal to $V_{ref}$. The output error is zero if this condition is met. The feedback path loop is a continuous process because of fluctuations in the magnitude of the power line voltage that provides the DC voltage $V_s$.

The embodiment of FIG. 2 is very similar to that of FIG. 1, and like components are identified with like character references. The major distinction in FIG. 2 is that this embodiment employs a feed forward approach. The output voltage $V_1$ is not monitored. The feedback line in FIG. 1 is removed. In its place, the power supply $V_s$ is supplied as an input of the pulse width modulator PWM which compares $V_s$ with the reference voltage $V_{ref}$. In order to satisfy the condition given as V1=$kV_{ref}$ a simple calculation is performed by the pulse width modulator to determine the appropriate duty cycle of the drive signal. The control factor is defined as:

$$\text{control factor} = \frac{kV_{ref}}{V_s} \quad \text{(Equation 1)}$$

From equation 1 above, it is seen that as the input power ($V_s$) fluctuates, the duty cycle of the drive signal will change accordingly in respect to the reciprocal of $V_s$. When $V_s$ is lower, the control factor (duty cycle) will increase and therefore provide compensation for the lower power line voltage. Feed forward is ideal for constant impedance loads and wide bandwidth requirements.

The embodiments of the invention as depicted in FIGS. 1 and 2 present the pulse width modulator power inverter system employing a combination of large numbers of power inverters. These power inverters are serially combined to produce a very high power system, up to megawatts. Every power amplifier is switching in-phase coherently allowing the voltage to combine serially without any mismatch and dissipation. The inverters are turned ON and OFF together and generate a fixed output voltage to the serial combiner at a variable duty cycle output. The output signal $V_0$ has the duty cycle relationship as the drive signal with the exception of the peak-to-peak level, is significantly larger. A pulse width modulated drive signal is easily amplified employing this approach.

The embodiments of FIGS. 1 and 2, as well as those to be described hereinafter with reference to FIGS. 3 and 4 all include a two-stage transformer employing single turn windings provides the maximum clearance between the high voltage loop HVL and the low voltage loop LVL. This is excellent geometry for high voltage isolation. The middle single turn voltage loop provides maximum distance from the windings of the toroid transformer. The single turn voltage loop coupling the low voltage loop to the high voltage loop allows maximum voltage clearance and it is the optimum geometry to provide this benefit. In addition, the single turn voltage loop may be electrically connected to the mean average voltage potential between the low voltage loop and the high voltage loop as indicated as $V_{mid}$. This will reduce the voltage gradient between the coupling loop to the transformers.

Cascaded primary and secondary transformers provide the following benefits:

A single turn coupling loop is used to provide the maximum voltage isolation in a smallest torroidal transformer configuration (i.e., the single turn of wire can be located in the center of the torroid, which is the maximum distance from the perimeter of the circular torroid). The reason of using the small torroid is that it provides better coupling, lower material cost, higher efficiency, and capable of operating at a higher switching frequency.

Cascade transformer configuration also provides the combining function of the voltages from the low-voltage transformers ($V_0$=sum of T1 to $T_m$). The combined output voltage ($V_0$) is redistributed equally to each of the high-voltage transformer ($V_0$=–sum of Thv/1 to Thv/x). Number of low-voltage transformer (T1 . . . $T_m$) and the number of high-voltage transformer (Thv/1 . . . Thv/x) can be any arbitrary number.

The circuits of FIGS. 3 and 4 have the ability of combining large numbers of power inverters. Power inverters are serially combined to produce a very high power system, up to Mega-watts power system. Every power amplifier is switching in-phase coherently allowing the voltage to combine serially without any mismatch and dissipation. An inverter that is turned ON will generate a fixed output voltage to the serial combiner. An inverter that is turned OFF will provide a short circuit node to the input transformer and in turn not effecting the total voltage at the combiner.

The series connected power inverters consist of a set of equal-weighted power inverters (PI-1 to PI-m) and binary weighted power inverters (BWPI-1 to BWPI-y). The combination of these modules creates an equivalent full scale Digital to Analog converter. Each power inverter is turned ON/OFF by the control signal from the modulation-encoder. Output of the combined signal is reconstructed to an analog signal in the serial combiner (T1 to Tm and TB1 to Tby). The smallest step of change is equaled to the least significant bit of the binary-weighted power inverter. Therefore, output peak to peak regulation is defined as:

$$v_{ripple}(\text{peak to peak})=2^{-n}V_1 \qquad \text{(Equation 2)}$$

Where:
 n number of binary bits
 $V_1$ nominal output voltage

Figure 5:
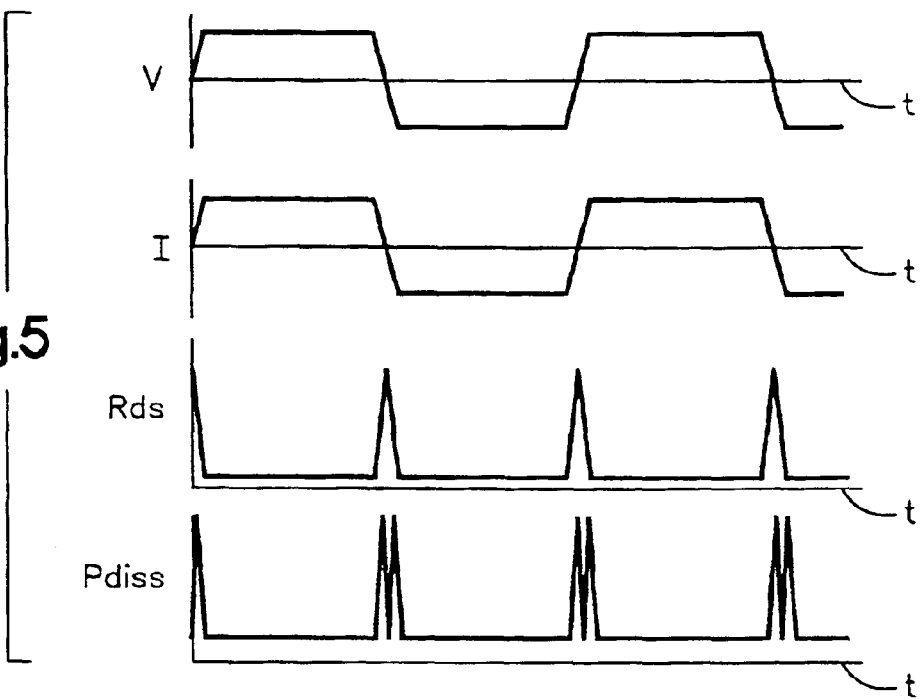
FIG. 5 illustrates various waveforms illustrating a portion of the invention herein.

Series components Ls and Cs located in the intermediate voltage loop are responsible for providing a sinusoidal current and phase shift. This is an important parameter if very high switching frequency is used for providing zero-current zero-voltage switching scheme and hence minimizing losses in the switching devices. FIG. 5 shows the circuit without the needs of series components Ls and Cs. The voltage (V) and current (I) are trapezoidal waveforms. Rds is drain to source resistance. Pdiss is transistor's power dissipation due to both switching losses and conduction loss.

Switching losses are a function of transistor's output capacitance, switching frequency, transistor's drain to source resistance, conduction current during turn ON and turn OFF, and how rapid is the device transition from the linear region to saturated region or vise versa. The switching losses of the transistor can be estimated as follows:

$$P_{switching\ losses} = \left(CV^2 + \frac{\Delta t I^2 Rds_{AVE}}{T}\right) f \qquad \text{(Equation 3)}$$

Where the conduction is a little simpler to define. It is a function of Rds and conduction current. $P_{conduction}=I^2Rds$ Requirements of Ls and Cs are not necessary if the switching losses are lower than the total conduction loss. Since the switching is a function of frequency assuming other parameters are remaining constant, Ls and Cs are needed if faster switching frequency is desired. Higher switching frequency provides a more compact power supply unit; this means smaller magnetic, smaller capacitors, smaller packaging, etc.

Figure 6:
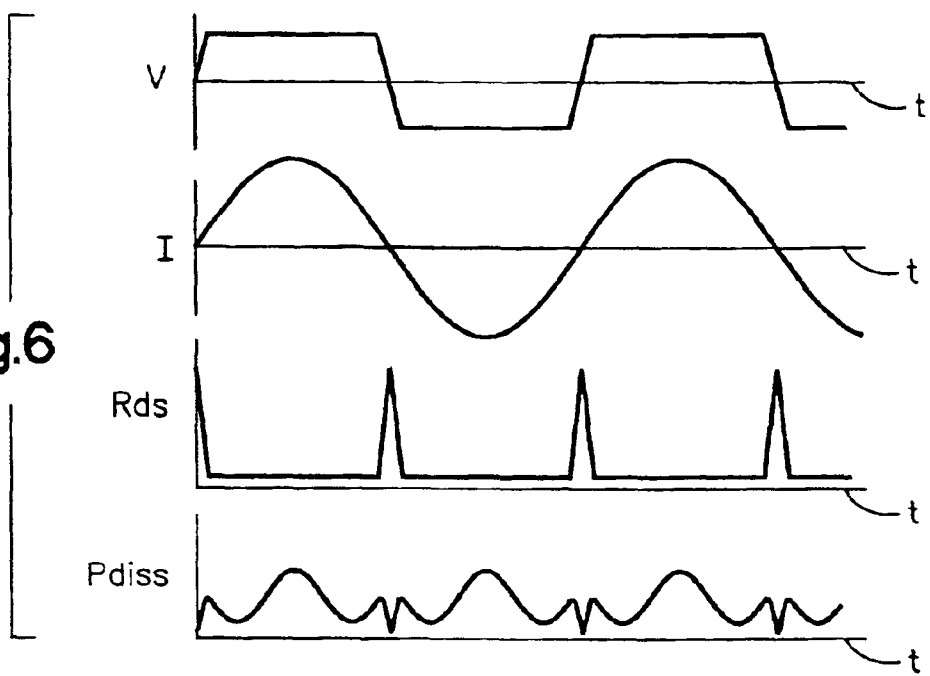
FIG. 6 is a series of waveforms illustrating a portion of the invention herein.

FIG. 6 shows the same power supply with sinusoidal output current when a series tuned circuit Ls and Cs is added. By adding these components, the circuit allows the power inverters with the capability of switching at zero-voltage zero-current to minimized switching dissipations. Ls and Cs should be used at a high switching frequency where switching losses are significantly higher than conduction losses. Ls and Cs are cost adder and should be used when necessary.

The graphs of FIG. 6 depict Pdiss near zero switching dissipation. Hence, higher switching rate is possible and maintains very low switching losses. Average rms conduction loss is unchanged regardless what is the switching frequency.

The advantage of the two-stage transformer is to provide maximum clearance between the high voltage loop and the low voltage loop. This is the best geometry for high voltage isolation application. The middle single turn voltage loop gives maximum distance from the windings of the torroid transformer. The single turn voltage loop coupling the low voltage to the high voltage allows maximum voltage clearance and it is the optimum geometry to provide this benefit.

All power inverters are synchronously switching. Output voltages are serially combined in-phase to development the desire output voltage.

The output of the modulation-encoder is a digital control signal, it is either a '1' or a '0'. Logic '1' will enable the output power inverter and produce a fixed level output to be added to the common combiner. $V_0=k_1V_1$ is the combined output voltage is always tracking with $V_{ref}$ regardless the input power line ($V_s$) fluctuation. The regulation or maintain constant $V_1$ can be achieved by one of the two methods shown in FIGS. 1 and 2.

FIG. 3 uses a feedback approach: $V_1$ is compared to $V_{ref}$ with a simple error amplifier. Output of the error amplifier is an error signal, which steers the modulation encoder to provide a negative compensation loop response to bring the $V_1$ equal to $V_{ref}$. Output error is zero if this condition is met. The feedback loop is a continuous process because of the power line fluctuation.

FIG. 4 uses a feed forward approach: Output voltage $V_1$ is not monitored. The feedback line shown in FIG. 1 is removed. In its place, the power supply line ($V_s$) is now being used and monitored. In order to satisfy the regulation condition given as $V_1=k \cdot V_{ref}$, a simple calculation is performed by the modulation encoder to determine the appropriate control signal. The control factor is defined as:

$$\text{control factor} = \frac{kV_{ref}}{V_s}.$$

As the input power line ($V_s$) fluctuate, number of power inverters turn on/off will changes accordingly in respect to the reciprocal of $V_s$. When $V_s$ is lower, the control factor will increase and therefore turn on more power inverters to compensate for the lower power line voltage.

From the above description of the invention, those skilled in the art will perceive improvements, changes and modifications. Such improvements, changes and modifications within the skill of the art are intended to be covered by the appended claims.

Having described the invention, I claim the following:

1. An RF amplifier system having improved power supply, comprising:
   a plurality of power amplifiers each having an output circuit for connecting a DC voltage source across one of a plurality of primary windings located on a first transformer;
   a controller that controls said amplifiers;
   said first transformer having a plurality of secondary windings located thereon with said secondary windings each being a single turn secondary winding, said secondary windings being connected together in series such that an output voltage is developed across said secondary windings of a value dependent upon the operation of said amplifiers;
   a second transformer located in a cascaded arrangement with said first transformer and having a like plurality of single turn primary windings connected together in series, said single turn primary windings on said second transformer being connected in parallel with the said single turn secondary windings on said first transformer;
   a like plurality of secondary windings are on said second transformer with each being connected to a rectifier for providing a controlled DC voltage.

2. A system as set forth in claim 1 wherein said controller includes a pulse width modulator that drives said amplifiers so as to have a variable on time.

3. A system as set forth in claim 1 wherein said controller includes a modulation encoder that selectively turns one or more of said amplifiers ON.

4. A system as set forth in claim 2 wherein said controller includes a feedback path for comparison of said controlled DC voltage with a reference voltage.

5. A system as set forth in claim 3 wherein said controller includes a feedback path for comparison of said controlled DC voltage with a reference voltage.

6. A system as set forth in claim 1 wherein said controller includes a feedback path for comparison of said controlled DC voltage with a reference voltage.

7. A system as set forth in claim 6 wherein said controller includes a pulse width modulator that drives said amplifiers so as to have a variable on time.

8. A system as set forth in claim 1 wherein said controller includes a feedback path for comparison of said controlled DC voltage with a reference voltage.

9. A system as set forth in claim 8 wherein said controller includes a modulation encoder that selectively turns one or more of said amplifiers ON.

* * * * *